US010062842B2

(12) United States Patent
Cho

(10) Patent No.: US 10,062,842 B2
(45) Date of Patent: Aug. 28, 2018

(54) COMPOSITE SELECTOR ELECTRODES

(71) Applicant: Hewlett Packard Enterprise Development LP, Houston, TX (US)

(72) Inventor: Hans S. Cho, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 2 days.

(21) Appl. No.: 15/500,044

(22) PCT Filed: Jan. 30, 2015

(86) PCT No.: PCT/US2015/013724
§ 371 (c)(1),
(2) Date: Jan. 28, 2017

(87) PCT Pub. No.: WO2016/122576
PCT Pub. Date: Aug. 4, 2016

(65) Prior Publication Data
US 2017/0271588 A1  Sep. 21, 2017

(51) Int. Cl.
*H01L 45/00* (2006.01)
*H01L 27/24* (2006.01)

(52) U.S. Cl.
CPC ...... *H01L 45/1253* (2013.01); *H01L 27/2418* (2013.01); *H01L 45/1233* (2013.01); *H01L 45/146* (2013.01); *H01L 45/16* (2013.01)

(58) Field of Classification Search
CPC .................................................. H01L 27/2418
See application file for complete search history.

(56) References Cited

U.S. PATENT DOCUMENTS

| 7,812,335 B2 | 10/2010 | Schuerlein |
| 8,766,234 B1 | 7/2014 | Hashim et al. |
| 2010/0193824 A1 | 8/2010 | Kim et al. |
| 2012/0074374 A1 | 3/2012 | Jo |
| 2013/0134382 A1 | 5/2013 | Martens et al. |
| 2013/0264534 A1 | 10/2013 | Hwang et al. |
| 2014/0027700 A1 | 1/2014 | Nickel et al. |
| 2014/0027705 A1 | 1/2014 | Yang et al. |
| 2014/0131794 A1 | 5/2014 | Ting et al. |
| 2014/0203236 A1 | 7/2014 | Chen et al. |

OTHER PUBLICATIONS

International Searching Authority, The International Search Report and the Written Opinion, PCT/US2015/013724, dated Oct. 28, 2015, 10 Pages.
Liu, X. et al., Reduced Threshold Current in NbO2 Selector by Engineering Decision Structure, Oct. 10, 2014, IEEE Electron Device Letters, 3 Pgs.
Zheng Yang et al, Oxide Electronics Utilizing Ultrafast Metal-Insulator Transitions, Annual Review of Materials Research, Mar. 30, 2011, vol. 41, pp. 337-367, DOI: 10.1146/annurev-matsci-062910-100347, See abstract, 2 Pgs.

*Primary Examiner* — Samuel Gebremariam
(74) *Attorney, Agent, or Firm* — Michael A. Dryja

(57) ABSTRACT

A composite selector electrode includes a switching layer coupled in electrical parallel with a conducting layer. The switching layer is electrically insulating when the temperature of the switching layer is below a threshold temperature. The switching layer exhibits insulator-metal transition at the threshold temperature. The switching layer is electrically conducting when the temperature of the switching layer is above the threshold temperature.

15 Claims, 4 Drawing Sheets

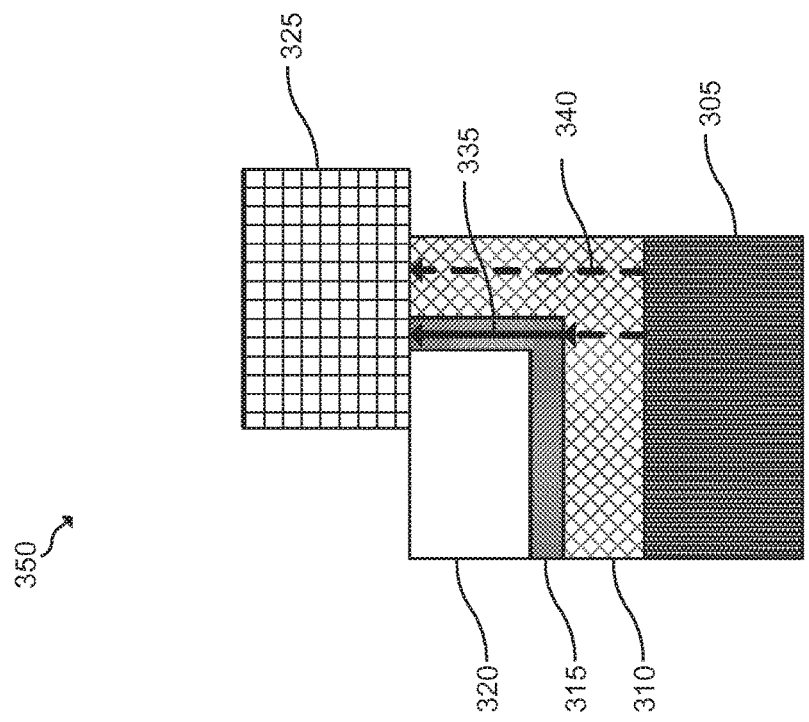
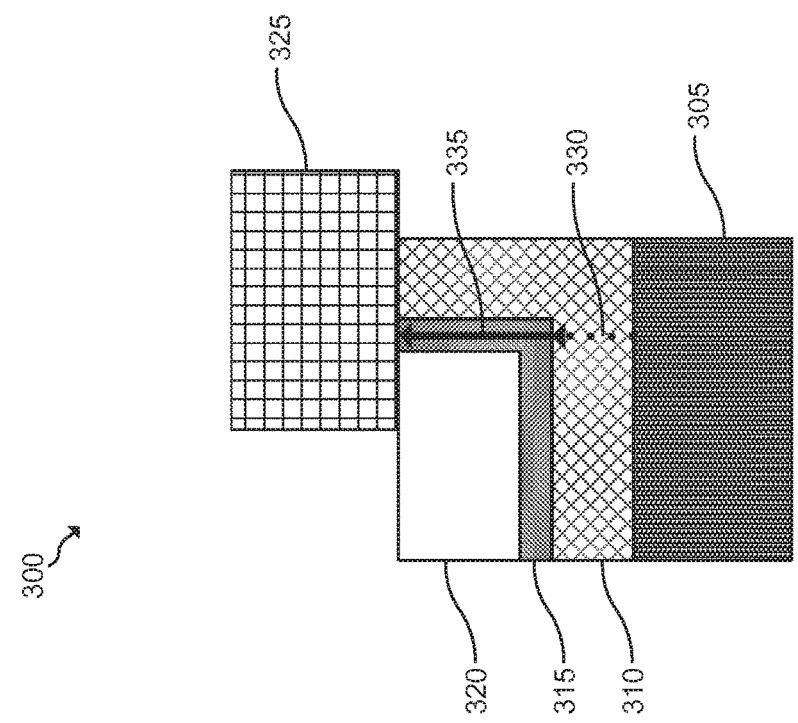
FIG. 3B
FIG. 3A

COMPOSITE SELECTOR ELECTRODES

BACKGROUND

Selectors are passive two terminal devices that may control the electrical properties such as the conductivity of electronic devices containing said selectors. Selectors may be combined with memristors to form crossbar arrays of memory devices. Memristors are passive two terminal devices that can be programmed to different resistive states by applying a programming energy, such as a voltage. Large crossbar arrays of memory devices can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein:

FIG. 3A is a diagram of a cross-sectional view of an example memristor having a composite selector electrode when a switching layer of the composite selector electrode is below a threshold temperature and when a voltage is applied across the composite selector electrode;

FIG. 3B is a diagram of a cross-sectional view of the example memristor of FIG. 3A when the switching layer is above the threshold temperature;

DETAILED DESCRIPTION

Figure 1:
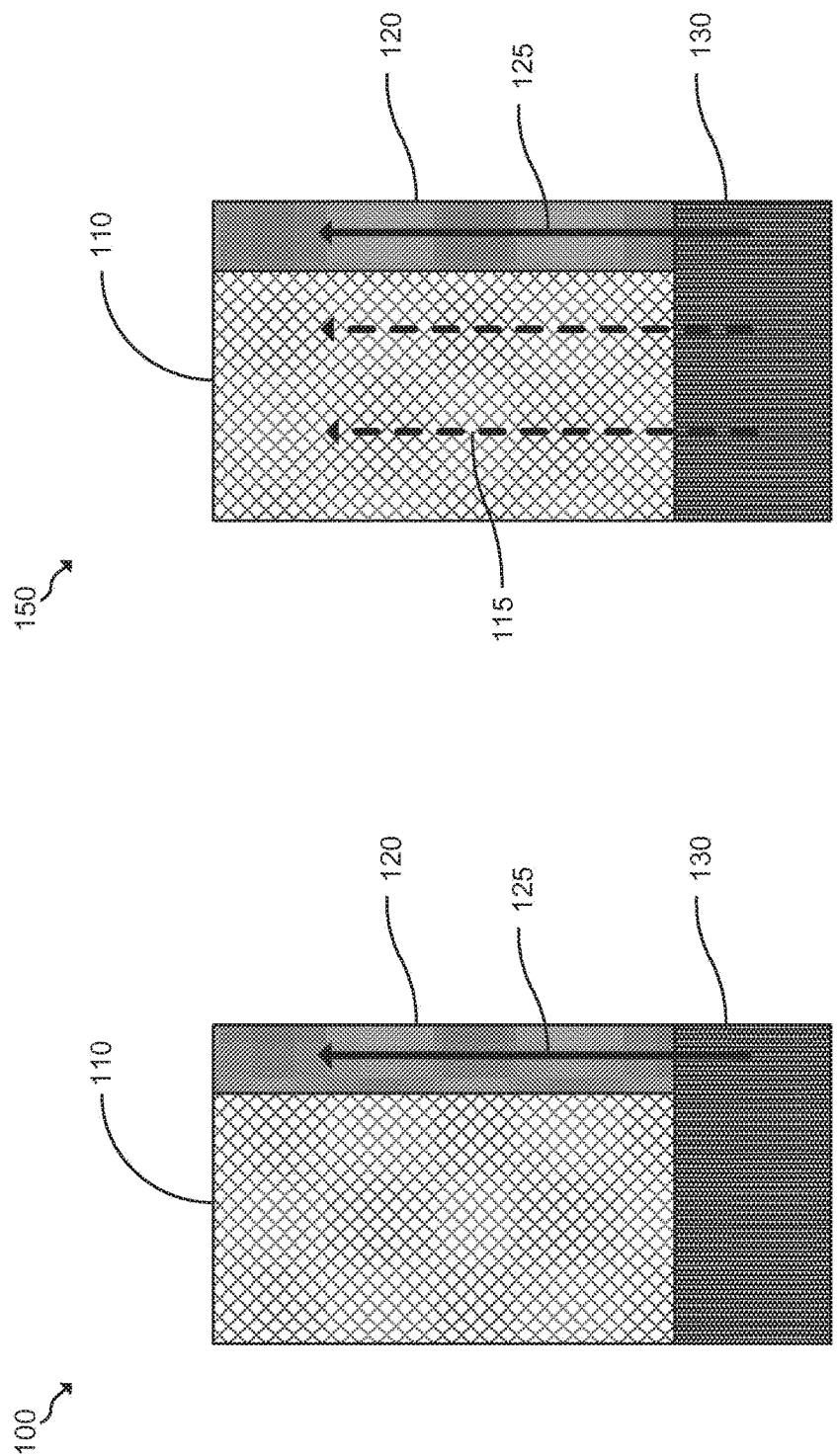
FIG. 1A is a diagram of a cross-sectional view of an example composite selector electrode when a switching layer is below a threshold temperature and when a voltage is applied across the composite selector electrode.
FIG. 1B is a diagram of a cross-sectional view of the example composite selector electrode of FIG. 1A when the switching layer is above the threshold temperature.

Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("ON") and one in which the channel forms a less conductive path ("OFF"). In some other cases, conductive paths represent "OFF" and less conductive paths represent "ON".

Using memristors in crossbar arrays may lead to read or write failure due to sneak currents passing through the memory cells that are not targeted—for example, cells on the same row or column as a targeted cell. Failure may arise when the total current through the circuit from an applied voltage is higher than the current through the targeted memristor due to current sneaking through untargeted neighboring cells. Using a transistor coupled in series with each memristor has been proposed to isolate each cell and overcome the sneak current. However, using a transistor with each memristor in a crossbar array limits array density and increases cost, which may impact commercialization. As a result, effort has been spent to investigate using a nonlinear selector coupled in series with each memristor in order to increase the current—voltage nonlinearity of each memory cell of a crossbar array. One type of selector being investigated exhibits so called insulator-metal transition (IMT), meaning that a selector transitions, at a threshold temperature or a threshold voltage level, from an electrically insulating state to an electrically conducting state similar to a metal.

However, some proposed selectors allow excessive leakage current in the insulator ("unselected") state. In other words, some selectors may not be resistive enough, or too conducting, in the unselected state. Furthermore, a selector is desired to have a high nonlinearity so that larger currents may flow at higher voltages. The combination of these two issues presents a challenge for currently proposed solutions because selectors with the desired resistance in the unselected state may not be conducting enough at higher voltages. In other words, these selectors may not be nonlinear enough.

Examples herein provide for composite selector electrodes for improving the performance of memristor devices. In example implementations, a composite selector electrode has a switching layer coupled in electrical parallel with a conducting layer with a relatively narrow cross sectional area, where the switching layer is electrically insulating when the switching layer is below a threshold temperature, the switching layer exhibits insulator-metal transition at the threshold temperature, and the switching layer is electrically conducting when its temperature is above the threshold temperature.

In this manner, composite selector electrodes may provide high nonlinearity. When the switching layer is below the threshold temperature, the current flowing through the composite selector primarily flows through the conducting layer, and is proportional to the inverse of the resistance of the conducting layer. The conducting layer may be thin to allow low current levels. When the temperature of the switching layer is increased so that it goes through IMT, the current may flow through the switching layer, increasing the cross-sectional area available for current flow. The conductivity of the composite selector electrode may increase nonlinearly until the entirety of the switching layer becomes conductive. There may be two mechanisms causing this effect. First, the resistive heating generated by the current flow through the conducting layer may increase the temperature of the adjacent switching layer, triggering insulator-metal transition that enables negative differential resistance current flow. Second, the voltage itself may increase above the threshold voltage for the switching layer, which itself may be a function of the temperature, and switch the layer from an insulating state to a conducting state. Generally, increasing the temperature of a selector decreases the threshold voltage for the onset of IMT. Accordingly, composite selector electrodes herein may be desirable for use in conjunction with memristor devices to increase the overall nonlinearity of the memristor.

Referring now to the figures FIG. 1A is a diagram of a cross-sectional view of an example composite selector electrode 100 when a switching layer 110 is below a threshold temperature and when a voltage is applied across the composite selector electrode 100. Composite selector electrode 100 may have a switching layer 110 coupled in electrical parallel with a conducting layer 120. A metal electrode 130 may be coupled in electrical series with both switching layer 110 and conducting layer 120. As used herein, components may be coupled by forming an electrical connection between the components. For example, switching layer 110 may be coupled to conducting layer 120 by forming a direct, surface contact between the two. When the temperature of switching layer 110 is below the threshold temperature, current 125 may primarily flow from metal electrode 130 through conducting layer 120, and not significantly through switching layer 110. In other words, prior to IMT, switching layer 110 may be significantly less conductive than conducting layer 120. Alternatively or in addition, the voltage applied across composite selector electrode 100 may be greater than a temperature-dependent threshold voltage for the switching layer 110.

Heat may be generated by the joule heating effects of conducting layer 120. For example, the current 125 delivered through conducting layer 120 may generate heat that may heat up switching layer 110. When the voltage is small, the current levels 125 through conducting layer 120 may not generate enough heat to heat switching layer 110 above its threshold temperature. When the voltage applied is larger, current 125 may generate enough joule heating in conducting layer 120 to promote the IMT of switching layer 110.

Composite selector electrode 100 may be an electrical device that may be used in memristor devices to provide desirable electrical properties. For example, composite selector electrode 100 may be a 2-terminal device or circuit element that admit a nonlinearly variable current dependent on the applied voltage across the terminals. In some examples, composite selector electrode 100 may be coupled in series with memristors or active regions of memristor devices. Furthermore, composite selector electrode 100 may be coupled in series with a conventional series selector to increase the overall nonlinear characteristics of the memristor beyond what may be possible with only a conventional selector. In some examples, composite selector electrode 100 may serve as an electrical connection for a memristor device.

Switching layer 110 may be an active region that exhibits switching properties depending on its temperature or on the level of voltage applied across it. For example, switching layer 110 may be electrically insulating when it is below a threshold temperature or when a voltage below a threshold voltage is applied. Threshold temperature may be a temperature or temperature range where switching layer 110 or a material of the switching layer undergoes IMT. Threshold voltage may be a particular voltage or voltage range where switching layer 110 or a material of the switching layer undergoes IMT. For example, switching layer 110 may be electrically conducting when it is above the threshold temperature or when a voltage above the threshold voltage is applied.

Switching layer 110 may include a number of materials. In some implementations, switching layer 110 may have a metal oxide. Non-limiting examples of viable metals for forming the metal oxide of switching layer 110 include niobium (Nb), tantalum (Ta), vanadium (V), titanium (Ti), and chromium (Cr). In some implementations, switching layer 110 may include niobium oxide.

Conducting Layer 120 may include an electrically conducting material. In some implementations, conducting layer 120 may be a thin film coupled to a larger switching layer 110. For example, the cross-sectional area of conducting layer 120 may be smaller than the cross-sectional area of switching layer 110. Thus, when a voltage is applied and switching layer 110 is in the insulating state, current 125 may be conducted through conducting layer 120. Due to the relative thinness of conducting layer 120, the total conducted current through composite selector electrode 100 may be small. Example materials for conducting layer 120 may include Pt, Ta, Hf, Zr, Al, Co, Ni, Fe, Nb, Mo, W, Cu, Ti, TiN, TaN, Ta$_2$N, WN$_2$, NbN, MoN, TiSi$_2$, TiSi, Ti$_5$Si$_3$, TaSi$_2$, WSi$_2$, NbSi$_2$, V$_3$Si, electrically doped Si polycrystalline, electrically doped Ge polycrystalline, and combinations thereof. In some implementations, conducting layer 120 may include titanium nitride.

Metal Electrode 130 may be an electrically conducting material that conducts current to composite selector electrode 100. In some examples, as described further below, metal electrode 130 may serve as a connection between composite selector electrode 100 and other components. For example, metal electrode 130 may connect composite selector electrode 100 with lines of a crossbar array, or it may, for example, itself serve as a line of the array. Example materials for metal electrode 130 may include conducting materials such as Pt, Ta, Hf, Zr, Al, Co, Ni, Fe, Nb, Mo, W, Cu, Ti, TiN, TaN, Ta$_2$N, WN$_2$, NbN, MoN, TiSi$_2$, TiSi, Ti$_5$Si$_3$, TaSi$_2$, WSi$_2$, NbSi$_2$, V$_3$Si, electrically doped Si polycrystalline, electrically doped Ge polycrystalline, and combinations thereof.

FIG. 1B is a diagram of a cross-sectional view of the example composite selector electrode 100 of FIG. 1A when the switching layer is above the threshold temperature. Switching layer 110 may undergo IMT at a threshold temperature, and switching layer may be electrically conducting at temperatures above the threshold. In such conditions, the total current through composite selector electrode 100 may nonlinearly increase, by the addition of current 115 following through switching layer 110 to the current 125 already flowing through conducting layer 120.

In some implementations, composite selector electrode 100 may exhibit nonlinear current-voltage (IV) behavior. This may be a result of the IMT of switching layer 110. For example, typical materials may follow Ohm's law, where the current through them is proportional to the voltage. For composite selector electrode 100, the current through it may be linearly proportional to the inverse of the resistance of the conducting layer 120, and therefore small, at low applied voltages. As the voltage is increased and the current with it, the conducting layer 120 may progressively undergo resistive heating, which may subsequently increase the temperature of the adjacent switching layer 110. When switching layer 110 reaches a threshold temperature, it may undergo an IMT transition and become conducting. The current may therefore flow through the heated portions of the switching layer 110 as well as the conducting layer 120, and the heating-induced increase in conductance rapidly accelerates, in a self-reinforcing feedback loop. The cross-sectional area available for current flow may increase from that which included only the conducting layer 120 to the combined cross-sectional areas of the conducting layer 120 and switching layer 110. The overall current flow may increase nonlinearly until the full cross section is conductive. As a result, the IV behavior in this voltage range may be highly nonlinear.

Figure 2:
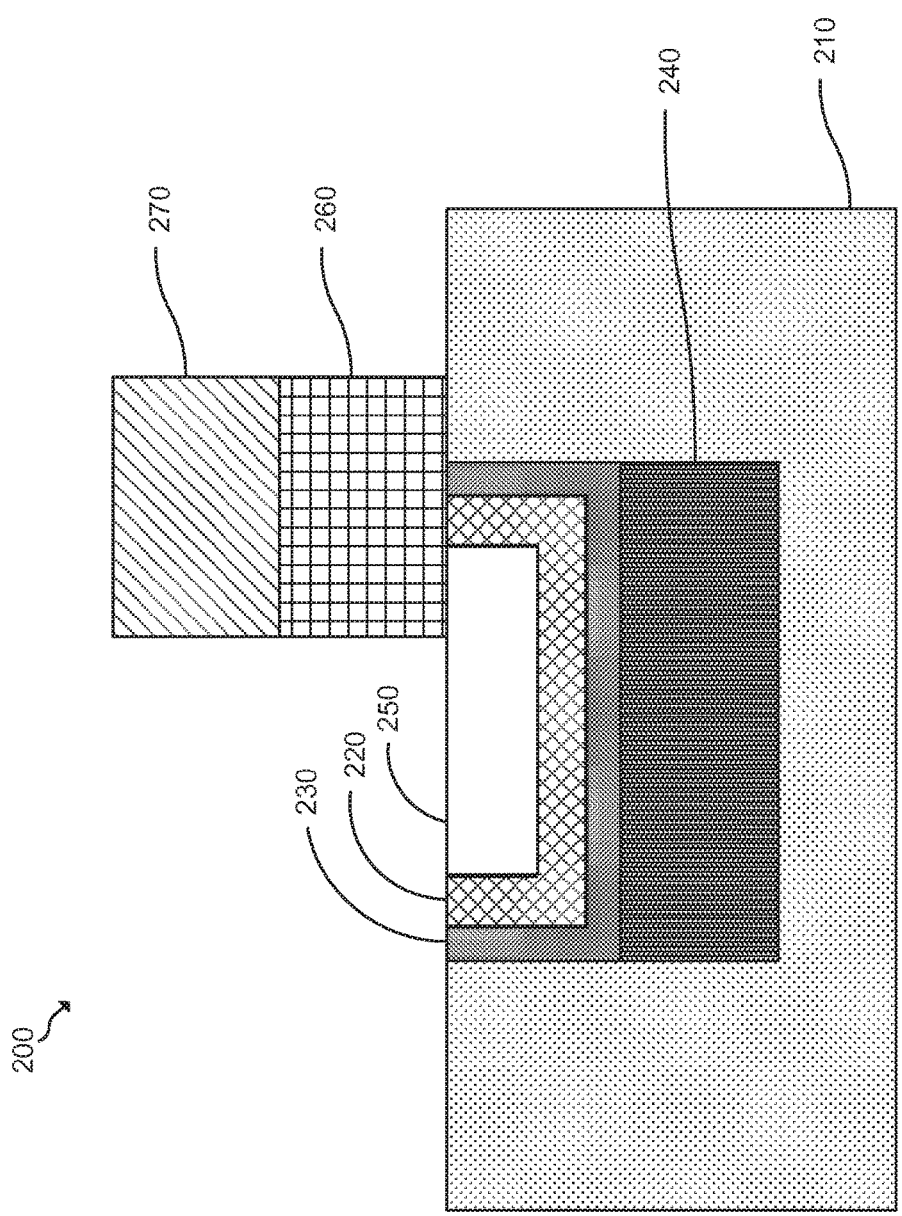
FIG. 2 is a diagram of a cross-sectional view of an example memristor having a composite selector electrode.

FIG. 2 is a diagram of a cross-sectional view of an example memristor 200 having a composite selector electrode. The composite selector electrode may be formed on a substrate 210, and may include a switching layer 220 coupled in electrical parallel with a conducting layer 230, a metal electrode 240 coupled in electrical series with switching layer 220 and conducting layer 230, and a dielectric 250. Memristor 200 may also have a memristive layer 260 coupled in electrical series with switching layer 220 and conducting layer 230, and a selector 270 coupled in electrical series with memristive layer 260 and the switching layer 220 and conducting layer 230 of the composite selector electrode.

In some implementations, memristor 200 may be one of a plurality of memristors that form a larger device, such as a crossbar array. For example, substrate 210 may be a circuit board or other structure that supports the crossbar array. In such instances, metal electrode 240 may function as the conducting lines of the array, that transports current to and the rest of memristor 200. A dense crossbar array of memristors, for example, may serve as the basis for devices such as memory.

The composite selector electrode may be similar to example composite selector electrode 100 of FIG. 1A. For example, switching layer 220, conducting layer 230, and metal electrode may be analogous to switching layer 110, conducting layer 120 and metal electrode 130 of FIG. 1A. Substrate 210 may be a material and/or surface onto which memristor 200 may be formed. For example, substrate 210 may be a thin slice of material such as silicon, silicon oxide, and generally other semiconductors or insulators. Furthermore, dielectric 250 may serve as an electrical insulator to isolate components from other components that may otherwise electrical interfere with each other's operations. For example, dielectric 250 may include oxides, nitrides, and carbon-doped materials.

Memristive layer 260 may be coupled in electrical series with switching layer 220 and with conducting layer 230. Memristive layer 260 may have a resistance that changes with an applied voltage or current. Furthermore, memristive layer 260 may "memorize" its last resistance. In this manner, memristor 200 having memristive layer 260 may be set to at least two states. Memristive layer 260 may be based on a variety of materials. Memristive layer 260 may be oxide-based, meaning that at least a portion of the layer is formed from an oxide-containing material. Memristive layer 260 may also be nitride-based, meaning that at least a portion of the layer is formed from a nitride-containing composition. Furthermore, Memristive layer 260 may be oxy-nitride based, meaning that a portion of the layer is formed from an oxide-containing material and that a portion of the layer is formed from a nitride-containing material. In some examples, memristive layer 260 may be formed based on tantalum oxide ($TaO_x$) or hafnium oxide ($HfO_x$) compositions. Other example materials of memristive layer 260 may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning memristive materials may be employed in the practice of the teachings herein. For example, memristive layer 260 may have multiple layers that include electrodes and dielectric materials.

Selector 270 may be coupled in electrical series with memristive layer 260 and with switching layer 220 and conducting layer 230 of the composite selector electrode. FIG. 2 shows selector 270 coupled to a face of memristor 260 that is opposite the face of memristor 260 that is coupled to switching layer 220 and conducting layer 230. However, the orientation may vary. For example, in some implementations, selector 270 may be sandwiched between memristor 260 and the switching layer and conducting layer. Selector 270 may be an electrical component placed in series with other components, such as memristor 260, that controls the overall electrical properties of the resulting devices. Selector 270 may provide nonlinearity, which may be further boosted by the effects of composite selector electrodes as taught herein.

Selector 270 may include a number of materials, including metal oxides and metal nitrides. Non-limiting examples include niobium oxide, tantalum oxide, vanadium oxide, titanium oxide, and chromium oxide. In addition, selector 270 may include a variety of other features and orientations. For example, selector 270 may include electrodes, dielectrics, and other materials. In some implementations, selector 270 may be coupled to or include another metal electrode which may serve as another line in the crossbar array.

During operation, a voltage applied to memristor 200 may deliver a current via metal electrode 220. When the temperature of the switching layer 220 is below its threshold temperature, a relatively small amount of current may travel through the relatively thin conducting layer 230 to be delivered to memristor 260. After the IMT of the switching layer 220, such by raising the temperature of switching layer 220 above its threshold temperature, current will also travel through the thicker switching layer, therefore increasing the total current delivered to memristor 260. Furthermore, selector 270 may behave similarly to the switching layer, thereby further increasing the total nonlinearity of the combined device.

FIG. 3A diagram of a cross-sectional view of an example memristor 300 having a composite selector electrode when a switching layer 310 of the composite selector electrode is below a threshold temperature and when a voltage is applied across the composite selector electrode. FIG. 3A shows a different configuration than FIG. 2, but the general principles remain the same. Furthermore, FIG. 3B is a diagram of a cross-sectional view of the example memristor 300 of FIG. 3A when the switching layer 310 is above the threshold temperature.

Memristor 300 may include a metal electrode 305. A switching layer 310 is coupled in series to metal electrode 305. A conducting layer 315 may be coupled in parallel to switching layer 310 and in series with metal electrode 305. In some implementations, conducting layer 315 may be thinner than switching layer 310. A dielectric material 320 may also be present to provide electrical insulation, structural support, and other properties. Memristor 325 may be coupled in electrical series to both switching layer 310 and conducting layer 315. Other components, such as a selector, may be included in memristor 300, but has been omitted from FIG. 3A for simplicity. The orientation of memristor 300 as shown in FIG. 3A may be formed by deposition of the layers, as further described herein relation to FIG. 4.

When the temperature of switching layer 310 is below the threshold temperature, very little current may travel through the composite selector electrode due to the switching layer being in an insulating state. However, some current 330 may tunnel through switching layer 310 and be delivered to memristor 325 by the part of current 335 being delivered through conducting layer 315. As a result, when a voltage below the threshold voltage is applied, the delivered current may be relatively very small.

On the other hand, when the switching layer 310 is above the threshold temperature, a much larger amount of current may travel through the composite selector electrode due to the switching layer being in a conducting state. This is illustrated in FIG. 3B, as a relatively large amount of current 340 is shown to be conducted through switching layer 310, in addition to the current 335 being delivered through conducting layer 315. As a result, after insulator-metal transition of switching layer 310, the delivered current may be disproportionately larger, thereby causing I-V nonlinearity.

Figure 4:
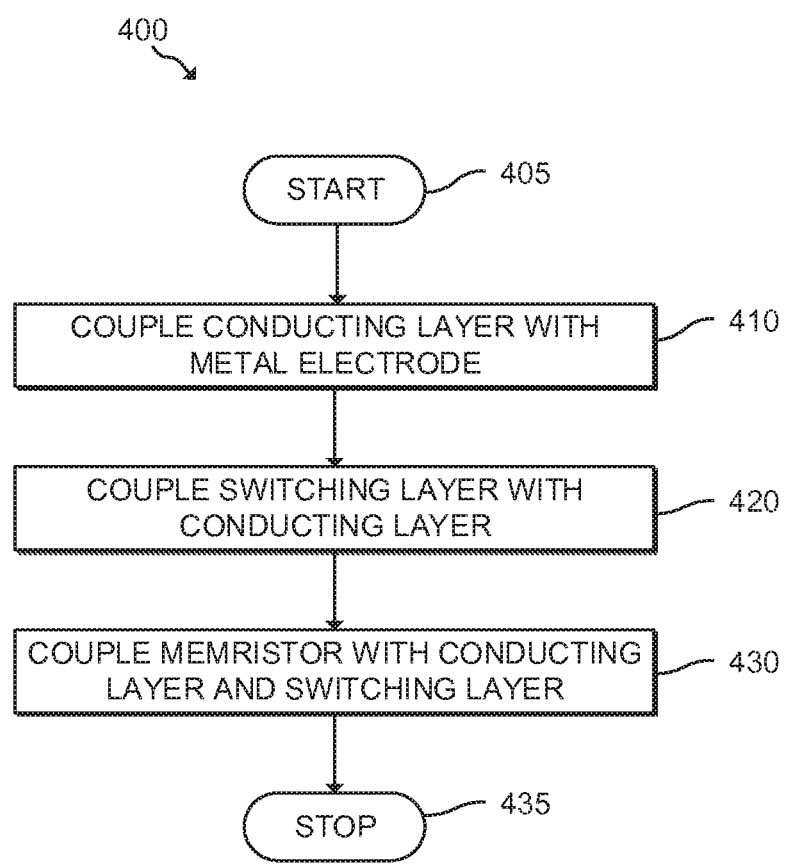
FIG. 4 is a flowchart of an example method of manufacturing a composite selector electrode.

FIG. 4 is a flowchart of an example method 400 of manufacturing a memristor. Method 400 may include block 410 for coupling a conducting layer with a metal electrode, block 420 for coupling a switching layer with the conducting layer so that the conducting layer and switching layer are in electrical parallel and so that the conducting layer and the switching layer are both in electrical series with the metal electrode, and block 430 for coupling a memristor with the conducting layer and with the switching layer so that the memristor is in electrical series with both the conducting layer and the switching layer. Although execution of method 400 is herein described in reference to memristor 200 of FIG. 2, other suitable parties for implementation of method 400 should be apparent, including examples provided in FIG. 1A, FIG. 1B, FIG. 3A, and FIG. 3B.

Method 400 may start in block 405 and proceed to block 410, where conducting layer 230 is coupled with metal electrode 240. Coupling may mean forming an electrically-conducting connection between components. For example, conducting layer 230 may be placed in physical contact with metal electrode 240. In some implementations, conducting layer 230 may be deposited as a thing film onto metal electrode 240. For example, metal electrode 240 may be provided in a trench or hole of substrate 210. Conducting layer 230 may then be subsequently deposited to conform to the surface of metal electrode 240 and to the walls of the trench or the hole. The layer of material of conducting layer 230 that confirms to the vertical walls of the trench or hole forms the series connection that will later be coupled to memristor 260.

After coupling conducting layer 230 with metal electrode 240, method 400 may proceed to block 420, where switching layer 220 is coupled with the conducting layer 230 so that the conducting layer 230 and switching layer 220 are in electrical parallel with each other and so that conducting layer 230 and switching layer 220 are both in electrical series with metal electrode 240. In some implementations, switching layer 220 may be coupled by depositing the material as a film onto conducting layer 230. Similar to the deposition of conducting layer 230, the switching layer 220 may conform to the surface of conducting layer 230, including the vertical walls. The layer of material of switching layer 230 that conforms to the vertical walls forms the series connection between metal electrode 240 and memristor 260. In some implementations, switching layer 220 may be thicker or significantly thicker than conducting layer 230.

Switching layer 220 may be electrically insulating when the switching layer is below a threshold temperature. Threshold temperature may be a particular temperature or temperature range where switching layer 220 or a material of the switching layer undergoes insulator-metal transition. For example, switching layer 220 may be electrically conducting when it is above the threshold temperature. In some implementations, the threshold temperature may be within a temperature range of interest, such as, for example, the typical temperature ranges experienced during reading or writing of the memristor 200 in a crossbar array.

After coupling the switching layer with the conducting layer, method 400 may proceed to block 430, where memristor 260 is coupled with conducting layer 230 and with switching layer 220 so that memristor 260 is in electrical series with the both the conducting layer and the switching layer. In some implementations, memristor 260 may be deposited onto the substrate 210 at the location of conducting layer 230 and switching layer 220. Memristor 260 may be deposited by a variety of methods. Furthermore, as described above in reference to FIG. 2, a dielectric layer 250 may provide additional structure support and electrical insulation to memristor 200. Additionally, other components, such as selector 270 may be included in the final device.

After coupling memristor 260 with switching layer 220 and conducting layer 230, method 400 may proceed to block 435 to stop.

The foregoing describes a number of examples for composite selector electrodes. It should be understood that the composite selector electrodes described herein may include additional components and that some of the components described herein may be removed or modified without departing from the scope of the composite selector electrodes or their applications. It should also be understood that the components depicted in the figures are not drawn to scale, and thus, the components may have different relative sizes with respect to each other than as shown in the figures.

It should be noted that, as used in this application and the appended claims, the singular forms "a," "an," and "the" include plural elements unless the context clearly dictates otherwise.

What is claimed is:

1. A composite selector electrode, comprising a switching layer coupled in electrical parallel with a conducting layer, wherein:
    the switching layer is electrically insulating when the temperature of the switching layer is below a threshold temperature;
    the switching layer exhibits insulator-metal transition at the threshold temperature; and
    the switching layer is electrically conducting when the temperature of the switching layer is above the threshold temperature.

2. The composite selector electrode of claim 1, wherein the switching layer comprises a metal oxide.

3. The composite selector electrode of claim 2, wherein the switching layer comprises niobium oxide, and the conducting layer comprises tantalum nitride or titanium nitride.

4. The composite selector electrode of claim 1, wherein the composite selector electrode exhibits nonlinear current-voltage behavior.

5. The composite selector electrode of claim 4, wherein the switching layer exhibits negative differential resistance.

6. The composite selector electrode of claim 1, further comprising a metal electrode coupled in electrical series with both the switching layer and the conducting layer.

7. The composite selector electrode of claim 1, wherein the switching layer exhibits insulator-metal transition at a threshold voltage.

8. A nonlinear memristor, comprising:
    a composite selector electrode, wherein the composite selector electrode comprises a switching layer coupled in electrical parallel with a conducting layer, and a metal electrode coupled in electrical series with the switching layer and the conducting layer;
    a memristive layer coupled in electrical series with the switching layer and the conducting layer of the composite selector electrode; and
    a selector coupled in electrical series with the memristive layer and the switching layer and the conducting layer of the composite selector electrode.

9. The memristor of claim 8, wherein:
    the switching layer of the composite selector electrode comprises a metal oxide;

the switching layer is electrically insulating when the temperature of the switching layer is below a threshold temperature;

the switching layer exhibits insulator-metal transition at the threshold temperature; and the switching layer is electrically conducting when the temperature of the switching layer is above the threshold temperature.

10. The memristor of claim 9, wherein the switching layer exhibits negative differential resistance.

11. The memristor of claim 9, wherein the switching layer of comprises niobium oxide, and the conducting layer of the composite selector electrode comprises tantalum nitride or titanium nitride.

12. The memristor of claim 8, wherein the memristive layer comprises a metal oxide, and the selector comprises a metal oxide.

13. A method of manufacturing a memristor, comprising:
coupling a conducting layer with a metal electrode;
coupling a switching layer with the conducting layer so that the conducting layer and switching layer are in electrical parallel and so that the conducting layer and the switching layer are both in electrical series with the metal electrode; and
coupling a memristor with the conducting layer and with the switching layer so that the memristor is in electrical series with both the conducting layer and the switching layer.

14. The method of claim 13, wherein the metal electrode is provided in a trench or a hole of a substrate, and wherein the conducting layer is deposited to conform to a vertical wall of the trench or the hole.

15. The method of claim 13, wherein:
the switching layer is electrically insulating when the temperature of the switching layer is below a threshold temperature;

the switching layer exhibits insulator-metal transition at the threshold temperature; and the switching layer is electrically conducting when the temperature of the switching layer is above the threshold temperature.

* * * * *